United States Patent [19]

Landgraf

[11] Patent Number: 5,345,424
[45] Date of Patent: Sep. 6, 1994

[54] POWER-UP RESET OVERRIDE ARCHITECTURE AND CIRCUIT FOR FLASH MEMORY

[75] Inventor: Marc Landgraf, Folsom, Calif.

[73] Assignee: Intel Corporation, Santa Clara, Calif.

[21] Appl. No.: 85,640

[22] Filed: Jun. 30, 1993

[51] Int. Cl.$^5$ ............................................. G11C 8/00
[52] U.S. Cl. ................................. 365/227; 365/185; 365/218; 365/900
[58] Field of Search ............... 365/185, 900, 218, 226, 365/227

[56] References Cited

U.S. PATENT DOCUMENTS

| | | | |
|---|---|---|---|
| 5,243,575 | 9/1993 | Sambandan et al. | 365/900 X |
| 5,247,655 | 9/1993 | Khan et al. | 365/227 X |
| 5,262,998 | 11/1993 | Mnich et al. | 365/227 X |

*Primary Examiner*—Joseph A. Popek
*Attorney, Agent, or Firm*—Blakely Sokoloff Taylor & Zafman

[57] ABSTRACT

A reset circuit in a system comprising a microprocessor coupled to a flash memory by a system bus. The reset circuit has a reset signal generation circuit, a sleep signal generation circuit and a reset override signal generation circuit. The reset signal generation circuit generates a reset signal when power is applied to the flash memory. The reset signal causes the flash memory to enter a predetermined reset state. The sleep signal generation circuit is coupled to the reset signal generation circuit. The sleep signal generation circuit generates a sleep signal. The sleep signal causes the reset signal generation circuit to enter an energy saving sleep mode when the flash memory is placed in the sleep mode. The reset signal causes the sleep signal generation circuit to reset and suppress generation of the sleep signal. The reset override signal generation circuit is coupled to the reset signal generation circuit. The reset override signal is generated during power-up. The reset override signal forces the reset signal generation circuit to generate the reset signal during power-up even if the reset signal generation circuit is receiving the sleep signal. The reset signal override circuit draws substantially no power when the flash memory is placed in the sleep mode.

28 Claims, 7 Drawing Sheets

RESET SIGNAL

POWER-UP RESET OVERRIDE ARCHITECTURE AND CIRCUIT FOR FLASH MEMORY

FIELD OF THE INVENTION

The present invention relates to power-up reset circuitry. More specifically, the present invention implements a power-up reset override for reset circuitry that has a sleep capability.

BACKGROUND OF THE INVENTION

It is quite common for electronic circuitry to have a reset function. In this way, when power is first applied to the circuitry, the reset function can be employed to set the circuitry to a predetermined reset state. Frequently, the reset function may be activated through hardware, or through software, at times other than power-up of the circuitry. In the former case, the reset function is activated by applying a reset signal to the circuitry to be reset. In the latter case, a software command is provided that forces a reset signal to be generated. Regardless of how the reset function is activated, the value of being able to reset circuitry to a predetermined reset state is well known to those of ordinary skill in the art.

It is also well known in the art that there is utility to providing a "sleep" function to electronic circuitry. When a sleep mode is entered, typically by the application of a sleep command, most, if not all, circuitry is placed in a mode where the circuitry does not draw power. Later, when the sleep mode is ended, the electronic circuitry returns to the state the circuitry had upon entering the sleep mode.

The sleep mode permits power consumption to be eliminated, or at least significantly reduced, when the circuitry is in the sleep mode. Exiting from the sleep mode differs from resetting because the circuitry will only return to the reset state when the sleep mode ends if that was the state in which the circuitry resided upon entering the sleep state. More frequently, the electronic circuitry will be in some state other than the initial state when entering the sleep mode.

SUMMARY AND OBJECTS OF THE INVENTION

One objective of the present invention is to provide circuitry that can sense a power-up condition and generate a signal that causes the reset function at the time power is applied and that, upon sensing a sleep signal, can be placed in a sleep state where it will not draw power.

Another objective of the present invention is to resolve a contention that exists at power-up between sleep signal generation circuitry that is attempting to put the power-up sensing and reset signal generation circuitry to sleep by generating a spurious sleep signal and the power-up sensing and reset signal generation circuitry that is attempting to reset the sleep signal generation circuitry.

Another objective of the present invention is to force the reset signal to be generated on power-up regardless of whether or not the sleep signal is also being generated on power-up.

These and other objects of the invention are provided for by a reset circuit in a system comprising a microprocessor coupled to a flash memory by a system bus. The reset circuit has a reset signal generation circuit, a sleep signal generation circuit and a reset override signal generation circuit. The reset signal generation circuit generates a reset signal when power is applied to the flash memory. The reset signal causes the flash memory to enter a predetermined reset state.

The sleep signal generation circuit is coupled to the reset signal generation circuit. The sleep signal generation circuit generates a sleep signal. The sleep signal causes the reset signal generation circuit to enter an energy saving sleep mode when the flash memory is placed in the sleep mode. The reset signal causes the sleep signal generation circuit to reset and suppress generation of the sleep signal.

The reset override signal generation circuit is coupled to the reset signal generation circuit. The reset override signal is generated during power-up. The reset override signal forces the reset signal generation circuit to generate the reset signal during power-up even if the reset signal generation circuit is receiving the sleep signal. The reset signal override circuit draws substantially no power when the flash memory is placed in the sleep mode.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

An architecture and circuitry is disclosed for implementing power-up reset override in a system that has power-up reset circuitry that can placed in a state where no power is drawn when a sleep mode is entered.

Figure 1:
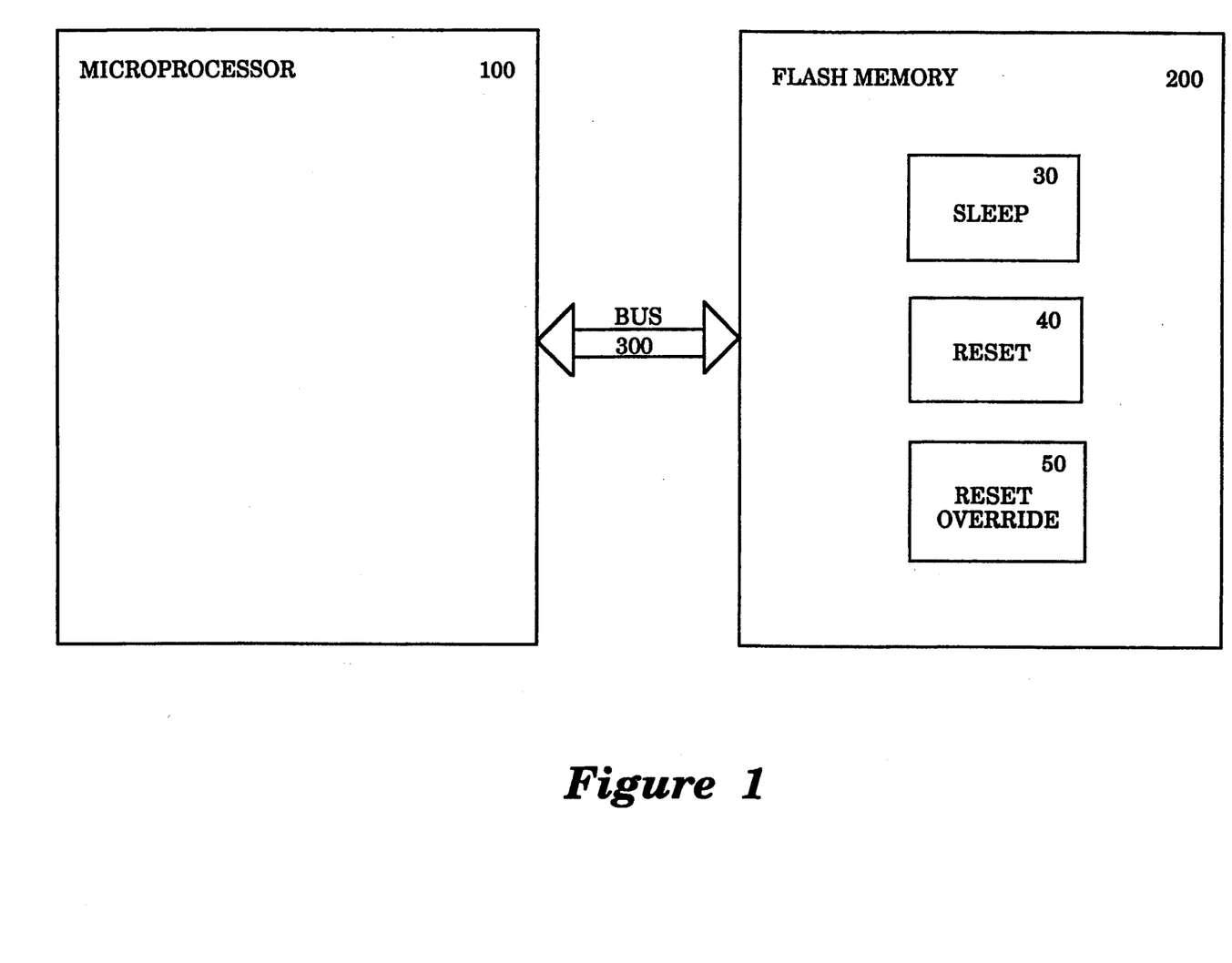
FIG. 1 illustrates a typical system that utilizes power-up reset override.

FIG. 1 depicts a typical system that utilizes power-up reset override. In FIG. 1, microprocessor 100 is coupled to flash memory device 200 by bus 300. It one embodiment, power-up reset override is provided in a system comprising microprocessor 100 coupled to flash memory device 200 by bus 300. Beyond the normal memory functionality of flash memory device 200, device 200 has sleep circuitry 30, reset circuitry 40, and reset override circuitry 50. Alternately, power-up reset override can be provided to any system having sleep circuitry 30, reset circuitry 40, and reset override circuitry 50.

In the embodiment of FIG. 1, microprocessor 100 will read data to, and write data from, flash memory 200 over bus 300. Whenever power is applied to flash memory 200, reset circuitry 40 will cause flash memory 200 to reset to a predetermined state. Reset generation circuitry 40 can also be caused to generate a reset signal through hardware or software means.

In the event that microprocessor 100 detects a period where data will not need to be read from, or written to, flash memory 200, microprocessor 100 can issue a sleep command to flash memory 200 via bus 300. The sleep command will cause sleep circuitry 30 to eliminate, or at least significantly reduce, the power consumption of flash memory 200 by shutting down all power consuming circuitry on flash memory 200.

Later, when microprocessor 100 needs to write data to, or read data from, flash memory 200, microprocessor 100 will issue a command via bus 300 to flash memory unit 200. This command will cause flash memory 200 to leave the sleep mode and return to the state in which it resided at the time that it received the sleep command. During this time, reset override circuitry 50 will prevent reset circuitry 40 from issuing a reset signal. In this way, it is ensured that flash memory 200 will return to the state in which it resided at the time that it received the sleep command, rather than enter the predetermined state caused by a reset condition.

Figure 2:
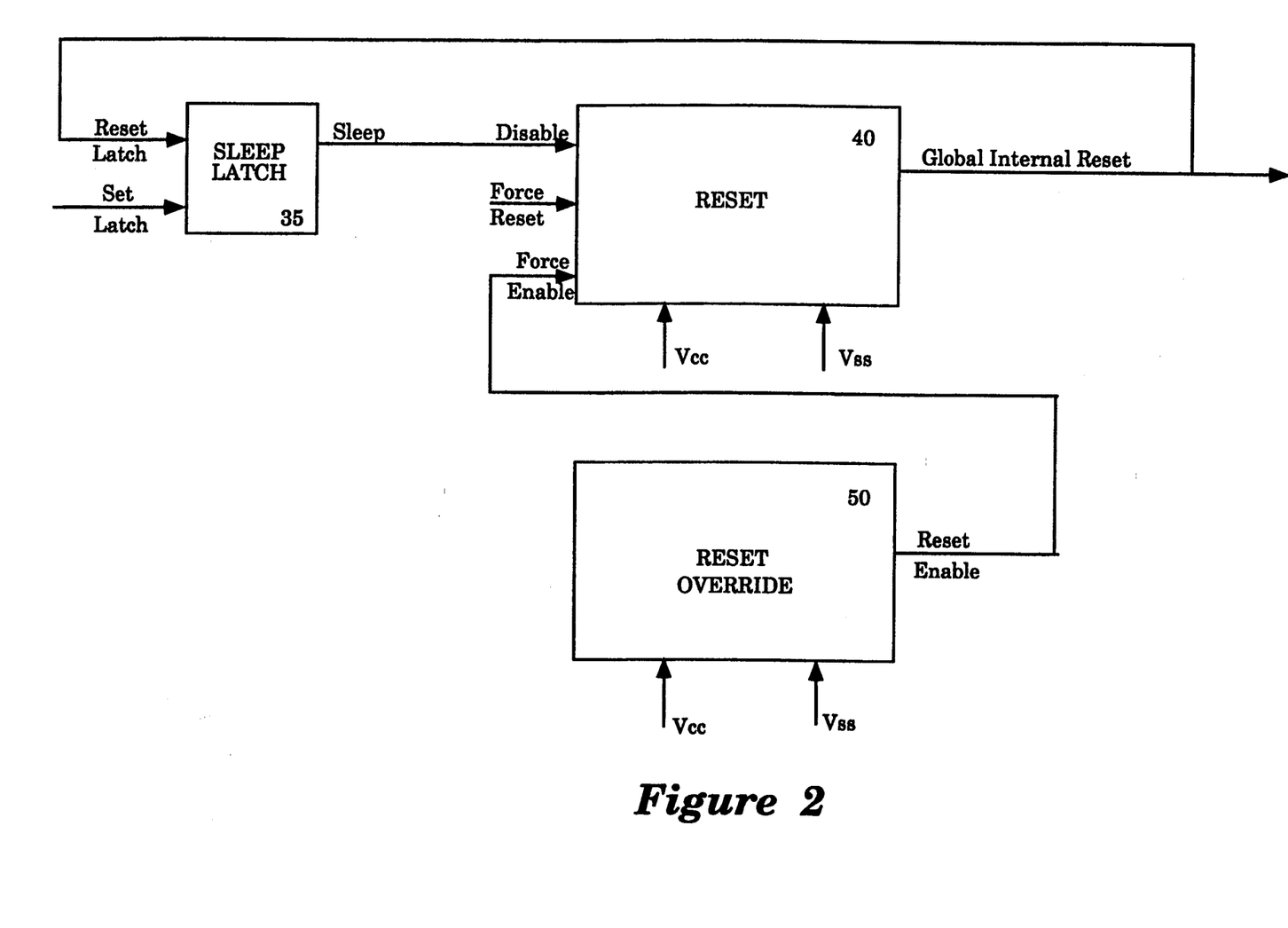
FIG. 2 is a block diagram that demonstrates the interplay between the sleep, reset, and reset override functions.

Referring now to FIG. 2, a block diagram is illustrated that depicts the interplay among the sleep, reset, and reset override circuits of one embodiment. In FIG. 2, reset circuit 40 has as its output a global internal reset signal. One pair of inputs to reset circuit 40 is system power "Vcc" and system ground "Vss". Reset circuit 40 has a lock out voltage "$V_{LO}$" that is significantly below the normal operation voltage level Vcc.

Before power is applied to the system, Vcc and Vss are equal. When power is supplied, however, Vcc ramps up to normal operational voltage. During this ramping process, reset circuit 40 generates a GLOBAL INTERNAL RESET signal until Vcc reaches the lock out voltage $V_{LO}$. At that time, the GLOBAL INTERNAL RESET signal drops to ground Vss and will no longer be asserted. Then, as long as Vcc remains at the normal operational voltage of the system, the GLOBAL INTERNAL RESET signal will remain at ground and not be asserted. If Vcc should fall below the lock out voltage $V_{LO}$, however, then the reset circuit 40 will once again assert the GLOBAL INTERNAL RESET signal when Vcc later rises back to $V_{LO}$. This situation would occur when the power is removed from the system and then restored.

The function of the GLOBAL INTERNAL RESET signal is to permit the system to be set to a predetermined known state. Thus, whenever Vcc rises from ground Vss to $V_{LO}$, the GLOBAL INTERNAL RESET signal will be asserted and the state of the system will be set to the predetermined state. Alternately, reset circuit 40 can also be supplied with an input (FORCE RESET) to force the assertion of the GLOBAL INTERNAL RESET signal whenever a hardware or software condition is met. In the first case, this will occur when a reset signal is asserted externally, typically by asserting a reset signal on a reset pin. In the later case, this will occur when an external reset command is given to the system to reset. The external reset command will cause reset circuitry 40 to assert the GLOBAL INTERNAL RESET signal upon sensing the command.

It is often desirable to provide a sleep mode that reduces, or ideally eliminates, the consumption of power by a system. Reset circuit 40 consumes power whenever Vcc is not equal to Vss. Therefore, sleep latch 35 can be set by a sleep command causing signal SET LATCH to be asserted. Sleep latch 35 has as an output a signal SLEEP that is in turn input as signal DISABLE into reset circuit 40. Thus, when the signal SLEEP is asserted, it causes reset circuit 40 to be disabled so that reset circuit 40 no longer draws power even though Vcc remains applied to reset circuit 40 at the normal operational voltage.

When reset circuitry 40 is re-enabled, as a result of the system leaving the sleep mode, components internal to reset circuit 40 will once again have power applied to them. Without reset override circuit 50, this power application would cause reset circuit 40 to assert the GLOBAL INTERNAL RESET signal until the voltage again rises to $V_{LO}$.

Note that there is a feedback of the GLOBAL INTERNAL RESET signal into sleep latch 35 from reset circuit 40. This is because, whenever the system is reset, it is desirable that the-system be reset to a predetermined state wherein the system is not in the sleep mode. Therefore, assertion of the GLOBAL INTERNAL RESET signal causes sleep latch 35 to be reset and hence not assert the sleep signal.

Also, note that the feedback of the GLOBAL INTERNAL RESET signal into sleep latch 35 causes a race condition. This is because, if sleep latch 35 is set, sleep latch 35 will assert the signal SLEEP thereby disabling reset circuit 40. At the same time, however, reset circuit 40 can assert signal RESET LATCH to force the system to the predetermined state that includes not being in sleep mode. Therefore, a contention exists between the reset circuit 40, which is attempting to reset sleep latch 35 and sleep latch 35, which is attempting to disable reset circuit 40.

It is the function of reset override circuit 50 to resolve the above-mentioned race condition. As will be described further below in conjunction with FIGS. 3-5, reset override 50 only draws power when Vcc ramps up from ground. The inputs to reset override circuit 50 are Vcc and Vss. The output of reset override circuit 50 is signal RESET ENABLE. In turn, RESET ENABLE is provided to reset circuit 40 as input signal FORCE ENABLE.

As will be explained below in connection with FIG. 4d, when the signal RESET ENABLE has a value that is within a certain voltage range, reset circuit 40 is forced to be enabled regardless of the state of-the signal SLEEP input to reset circuit 40. Therefore, when power is initially applied to the system, reset circuit 40 will be forced to assert the GLOBAL INTERNAL RESET signal thereby forcing the system to the predetermined reset state. On the other hand, reset circuit 40 will not assert the GLOBAL INTERNAL RESET signal when the system emerges from sleep mode. In this way, the system will be forced to return to the state it had when the sleep state was entered, rather than returning to the predetermined reset state.

Figure 3:
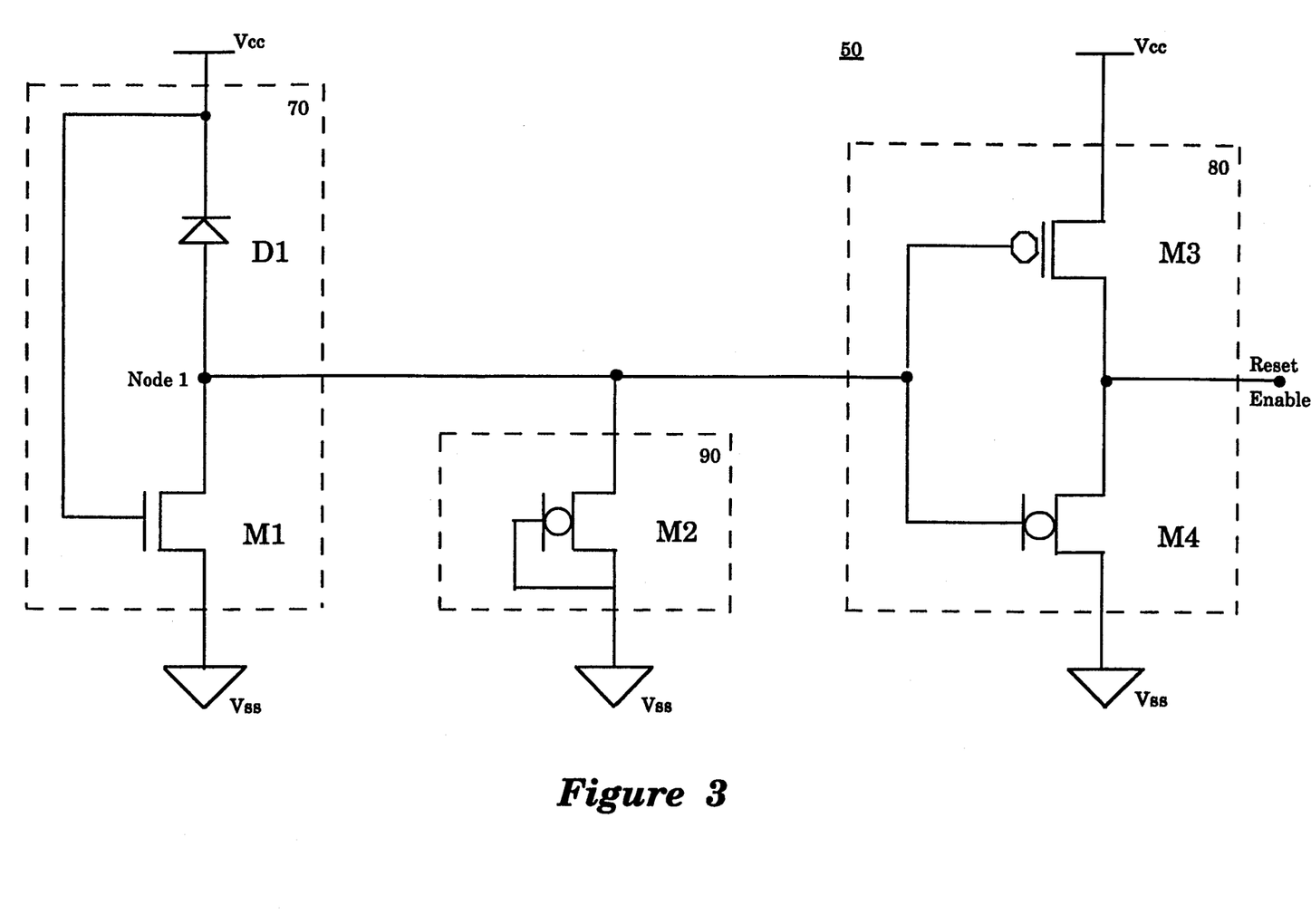
FIG. 3 illustrates one embodiment of power-up reset override circuitry.

Referring now to FIG. 3, one embodiment of reset override circuit 50 is disclosed. In FIG. 3, it can be seen that reset override 50 is composed of three sub circuits: reset override condition sensor 70; buffer and inverter circuit 80; and voltage clamp 90. Reset override condition sensor 70 and buffer and inverter circuit 80 provide the core of the functionality of reset override circuit 50. The operation of these two circuits will be described below in greater detail in connection with FIGS. 4a–d. Voltage clamp 90 is not essential to the operation of the circuit if a design constraint is placed on the system to ensure that the system voltage does not power down to ground and then power back up in a rapid manner. Without this design constraint, in the case where power to the system is brought from the operational voltage to ground and then rapidly returned to the operational voltage, voltage clamp 90 ensures the proper operation of the reset override circuit. The function of voltage clamp 90 will be explained below in greater detail in connection with FIGS. 5a–d.

It is well known in the art that transistors may be used as switches. Furthermore, it is well known in the art how to manufacture different types of transistors so that each transistor type has a different threshold voltage (i.e. threshold voltage being the voltage at which the transistor switches on). The key to understanding the operation of power override circuit 50 is to understand that transistor M1 of the reset override condition sensor circuit 70 and transistor M4 of the buffer and inverter circuit 80 have been selected such that the threshold voltage of transistor M1 "VtM1" is significantly lower than the lock out voltage of reset circuit 40 (FIG. 2) and the threshold voltage of transistor M4 "VtM4" is significantly lower than the threshold voltage of transistor M1. Note that the lock out voltage of reset circuit 40, was selected to be significantly lower than the normal operating voltage of the system. In one embodiment, the following DC voltages with respect to ground of 5.0, 3.0, 1.5, and 0.3, are used for the operational voltage, $V_{LO}$, VtM1, and VtM4, respectively. It is not the actual values of these voltages, however, but the relationship among these voltages that permits power-up reset override to work.

Referring now to reset override condition sensor circuit 70, it can be seen that the inputs to circuit 70 are Vcc and Vss, and the output from circuit 70 is the signal that appears at node 1.

In one embodiment, reset override condition sensor 70 is comprised of two elements, diode D1 and transistor M1. Diode D1 is a diode that is always reversed bias in this embodiment. Diode D1 has been made physically large so that it will have a large capacitance. Alternatively, a capacitor, or any component having a sufficiently large capacitance, can be employed in place of diode D1. Transistor M1 is an N channel transistor and has a threshold voltage that is below the lock out voltage of reset circuit 40.

The operation of reset override condition sensor circuit 70 is as follows. Initially Vcc is at ground and therefore diode D1 and transistor M1 are off. When power is applied, Vcc ramps up to the operational voltage. Although Vcc increases, M1 remains off as long as Vcc is below the threshold of transistor M1. Diode D1, however, has been constructed so that it has a large capacitance value. Therefore, as the power supply ramps up, the capacitance of diode D1 will hold voltage causing that the voltage at node 1 to rise with Vcc. Then, when Vcc has risen to the threshold voltage for transistor M1, transistor M1 will switch on bringing the voltage at node 1 to ground. Note that because D1 is reversed bias, there is never any substantial DC flow.

Figure 4A:
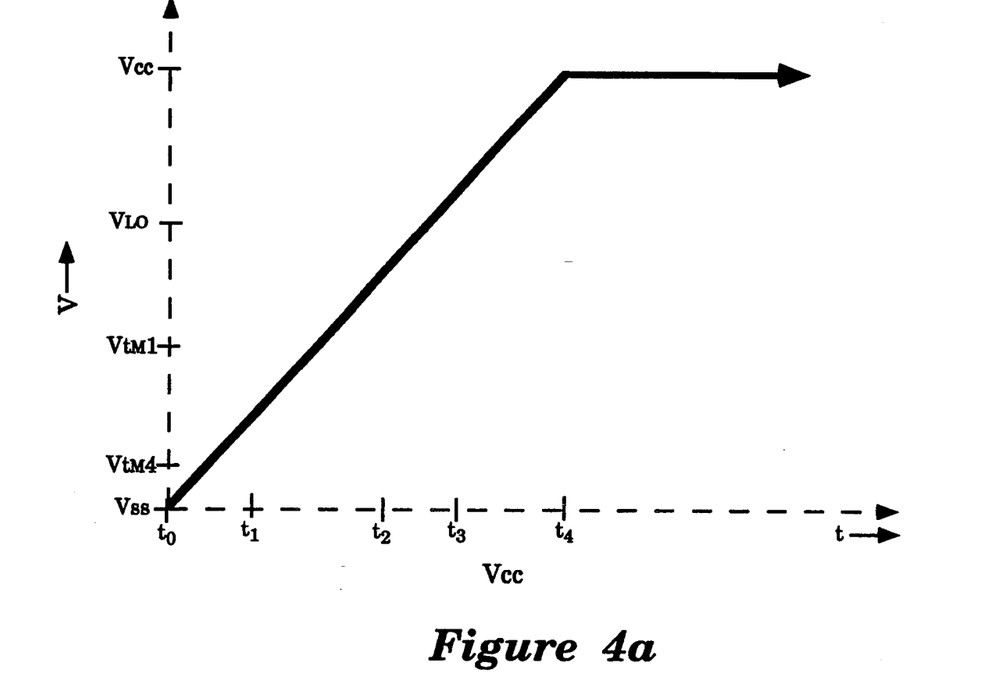
FIG. 4a illustrates ramping-up of system power when power is first applied to the system.

Referring now to FIG. 4a, a power-up ramp for system power is depicted. In FIG. 4a it can be seen that, when power is provided to the system, it rises from system ground Vss at time $t_0$ to system operational voltage Vcc at time $t_4$.

Figure 4B:
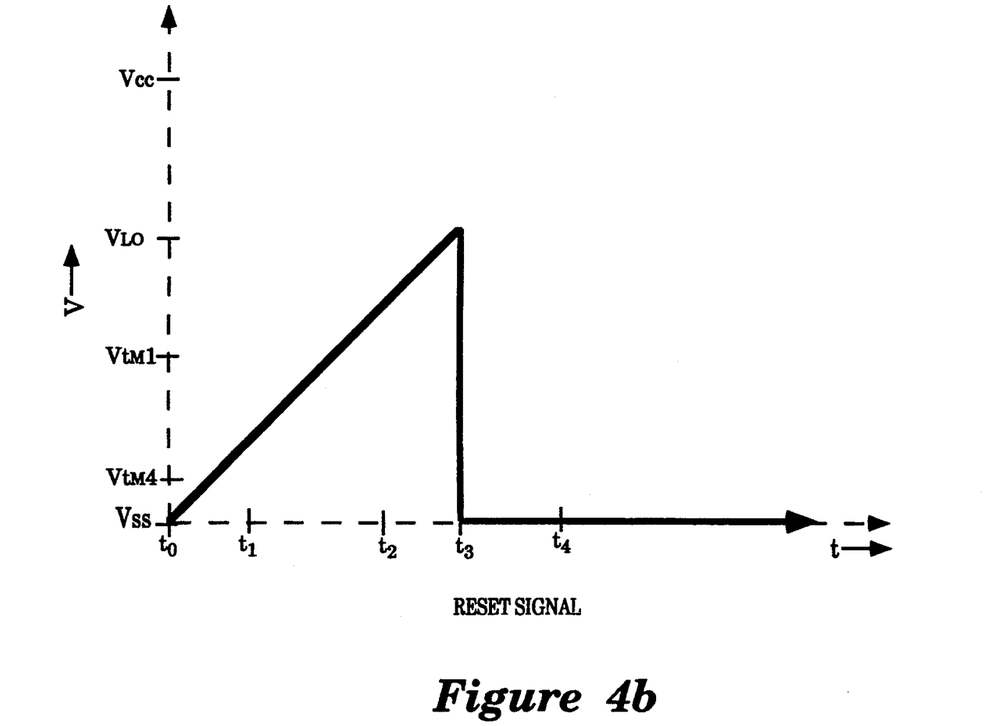
FIG. 4b illustrates the power-up reset signal generated when power is first applied to the system.

Referring now to FIG. 4b, the value of the reset signal output from reset circuit 40 of FIG. 2 can be seen. When power is initially applied to the system, the GLOBAL INTERNAL RESET signal follows the system power ramp of FIG. 4a as Vcc rises from ground to the normal operating voltage. At time $t_3$, however, when Vcc reaches $V_{LO}$, the lock out voltage of reset circuit 40, the reset signal drops back to ground where it remains until the next reset condition is encountered.

Figure 4C:
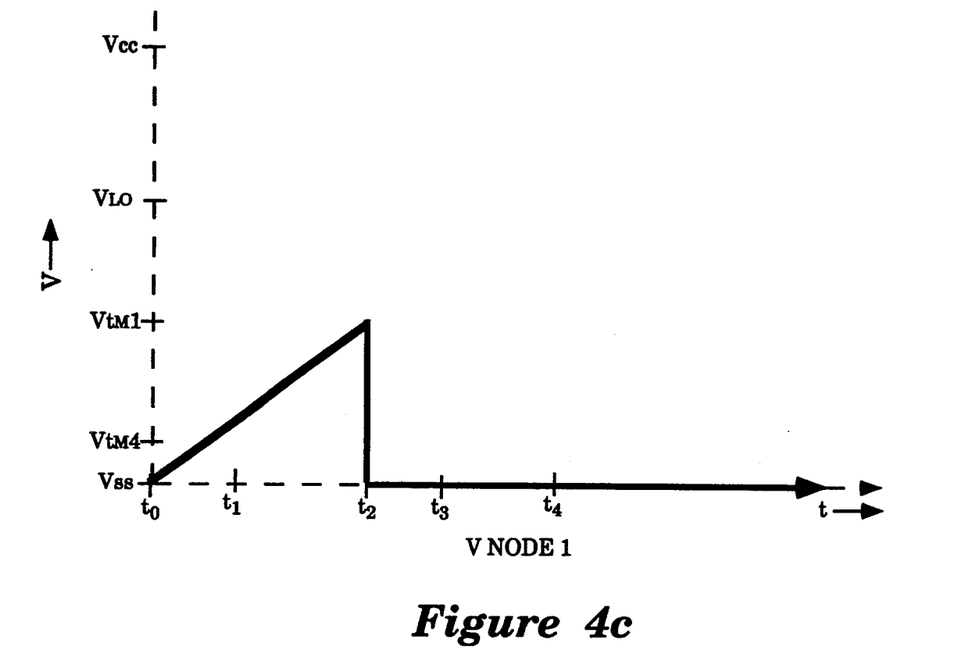
FIG. 4c illustrates the voltage at Node 1 of FIG. 3 when power is first applied to the system.

Referring now to FIG. 4c, it can be seen that the voltage at node 1 "Vnode1" has a similar pattern to that of the reset signal. At time $t_0$, the voltage at node 1 is equal to ground Vss. When power is applied to the system, Vnode1 follows Vcc as it ramps up to the operational voltage. During the time from $t_0$ to $t_2$, diode D1 acts as a capacitor and the voltage at node 1 rises along with the reset signal and Vcc. At time $t_2$, however, when the voltage at node 1 of diode D1 reaches the threshold voltage of transistor M1, transistor M1 turns on thereby bringing the voltage at node 1 to ground where it remains until a time (not shown) when Vcc again drops below the threshold voltage for transistor M1.

Figure 4D:
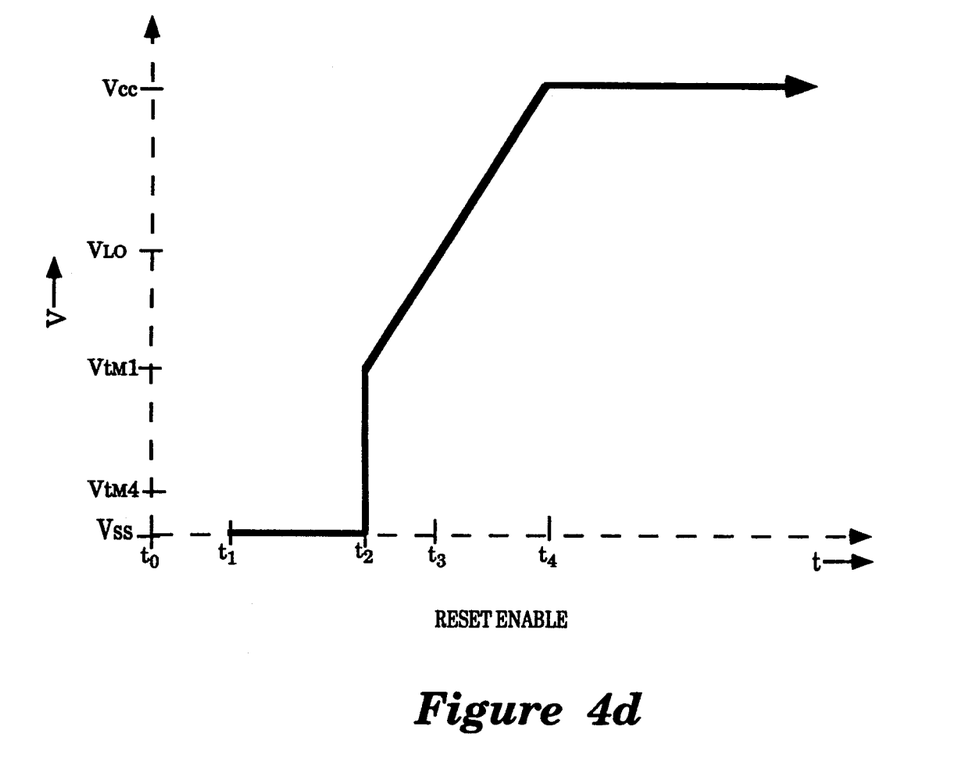
FIG. 4d illustrates the voltage of the Reset Enable signal following application of power to the system.

Referring now to FIG. 4d, the value of the signal RESET ENABLE is depicted. An output of reset override circuit 50, and more particularly, signal RESET ENABLE is an output of buffer and inverter circuit 80. Referring again to FIG. 3, it can be seen that the inputs to buffer and inverter circuit 80 are Vss, Vcc and the voltage at node 1. At time $t_0$, Vss, Vcc, and the voltage at node 1 are all equal to system ground. Therefore, transistors M3 and M4 are turned off and the voltage level of the signal RESET ENABLE is undetermined. At time $t_1$, however, the voltage at node 1 reaches the threshold voltage for transistor M4, thereby turning on transistor M4 and pulling the signal RESET ENABLE to ground. At time $t_2$, the voltage at Node 1 goes from Vcc to ground and turns on M3. As soon as transistor M3 turns on, the signal RESET ENABLE transitions from zero to the value of Vcc, that, at time $t_2$, is equal to the voltage threshold for transistor M1. The reset enable signal then continues to follow the Vcc ramp until it reaches the system operating voltage at time $t_4$, and remains constant thereafter.

Figure 5A:
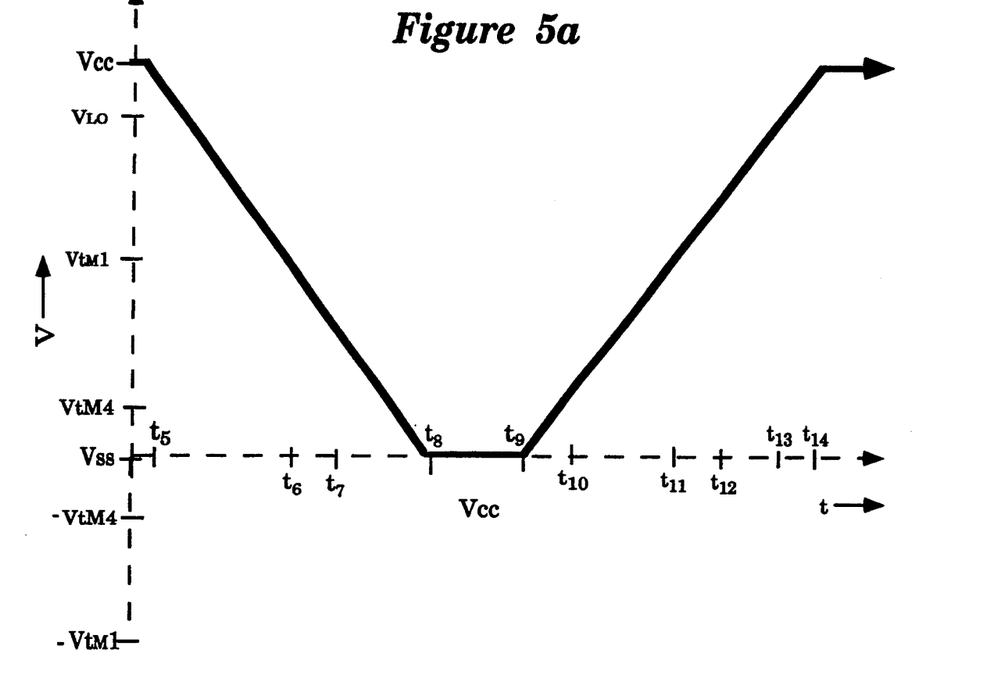
FIG. 5a illustrates system voltage as the system is powered-down and then as power is rapidly restored.

Referring now to FIG. 5a, the value of the system power voltage Vcc is shown as power is removed from the system and then rapidly reapplied. At time $t_5$, the system power voltage Vcc is equal to the normal operational voltage of the system. When power is removed at time $t_5$ the system power begins to ramp down until it reaches ground at time $t_8$. The system power then remains at ground until time $t_9$ when power is reapplied. At time $t_9$ the system power begins to ramp back, in a manner similar to that described in FIG. 4a, until it reaches the system operational voltage at time $t_{14}$.

Figure 5B:
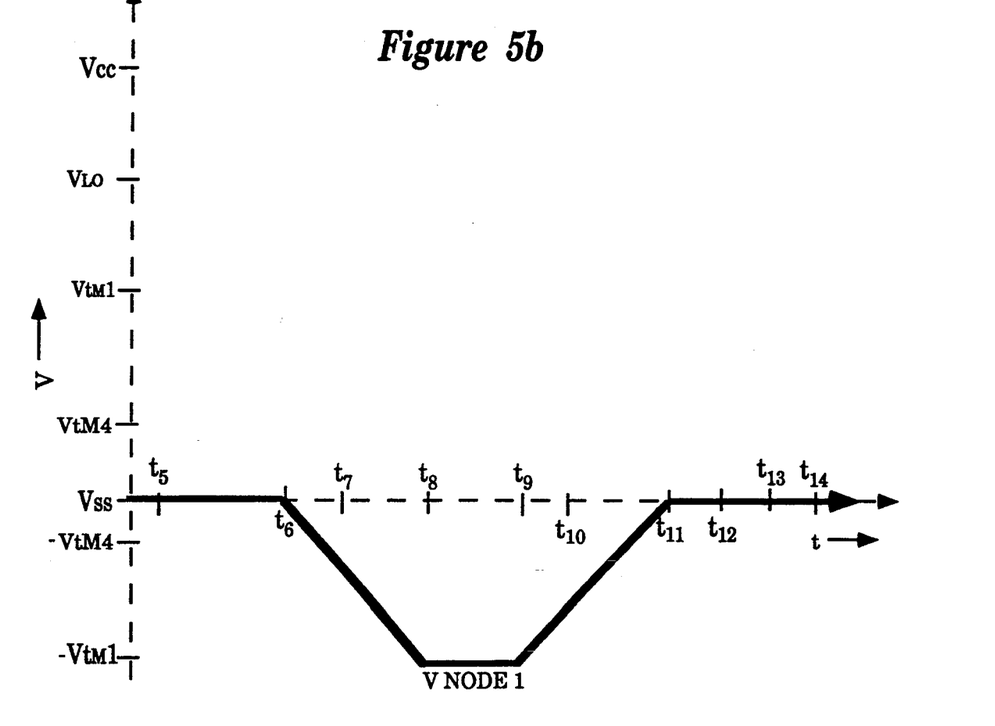
FIG. 5b illustrates the voltage at Node 1 of FIG. 3 if transistor M2 were not present in the circuit of FIG. 3.

Referring now to FIG. 5b, the voltage at node 1 is shown during the power cycle of FIG. 5a as it would appear if voltage clamp circuit 90 of FIG. 3 were not included in reset override circuit 50. In FIG. 5b, it can be seen that the voltage at node 1 would equal ground at time $t_5$ because transistor M1 would be on. At time $t_6$, however, Vcc would reach VtM1 and transistor M1 would switch off. As soon as transistor M1 switched off at time $t_6$ the capacitive action of diode D1 would cause a negative voltage at node 1 to begin ramping down from ground.

This negative voltage at node 1 would continue to decrease until time $t_8$, when system power reached ground. Then, the voltage at node 1 would remain at the negative threshold voltage of transistor M1 for a small amount of time. If, the power to the system were restored before the voltage at node 1 had a chance to return to ground through leakage, the voltage at node 1 would follow the ramp of Vcc when power was reapplied at time $t_9$. The voltage at Node 1 at time $t_9$, however, would be based at the negative threshold voltage of transistor M1. Therefore, at time $t_9$ the voltage at node 1 would rise from the negative threshold voltage of transistor M1 to system ground at time $t_{11}$. Then, at time $t_{11}$ transistor M1 would switch on and hold the voltage at node 1 to ground. In such an event, the voltage at node 1 would never be high enough to switch on transistor M4 and the signal RESET ENABLE would fail to be generated. This would result in the possible race condition between the sleep mode signal generation circuit and the reset signal generation circuit as described above.

Figure 5C:
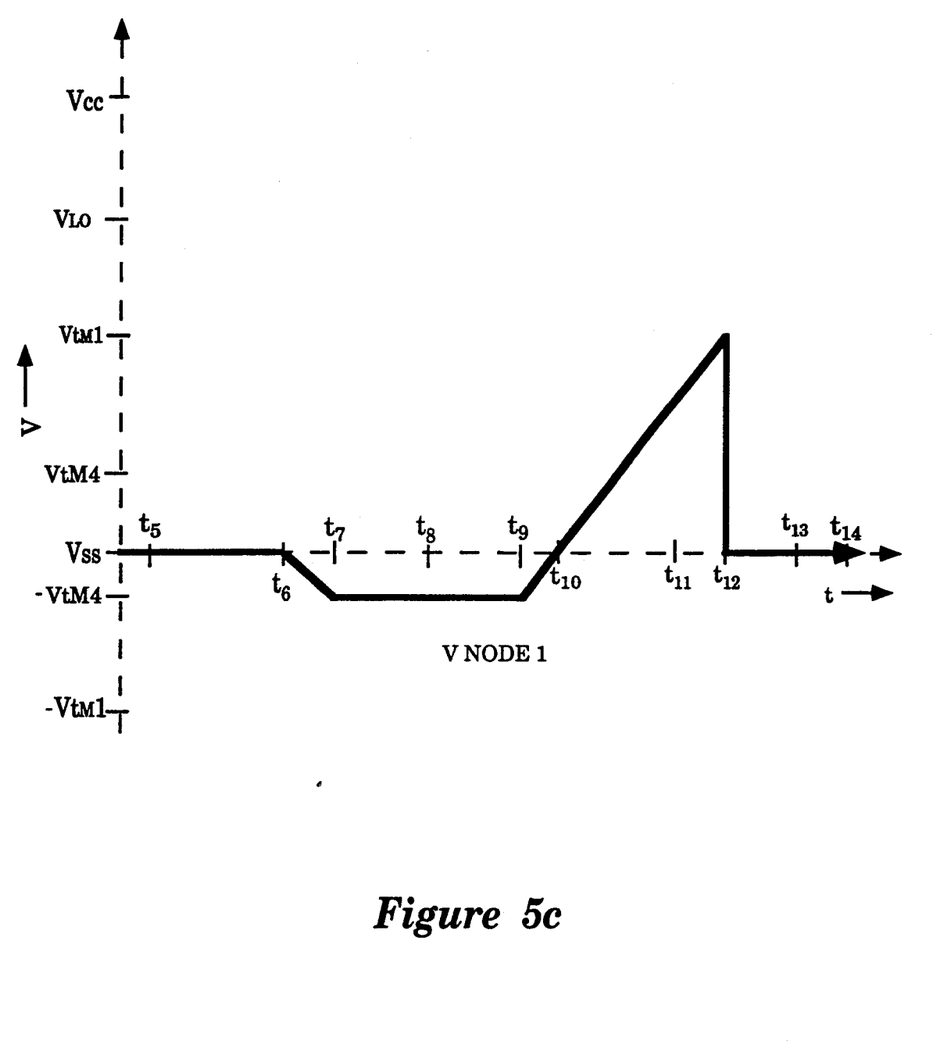
FIG. 5c illustrates the voltage of Node 1 of FIG. 3 when transistor M3 is included in the circuit of FIG. 3.

Referring now to FIG. 3, and more specifically to voltage clamp sub circuit 90, it can be seen that voltage clamp 90 is comprised of transistor M2. In one embodiment, transistor M2 has the same threshold voltage as transistor M4. Therefore, as can be seen in FIG. 5c, the voltage at node 1 will begin to drop from ground at time $t_6$ and the voltage at node I will continue to drop until it reaches a value equal to the negative threshold voltage of transistor M2 time $t_7$. At time $t_7$, transistor M2 will switch on bringing the voltage at node I equal to (system ground (Vss) minus VtM4). Then, when power is reapplied to the system at time $t_9$, the voltage at node 1 will rise from (system ground (Vss) minus VtM4) and reach system ground at time $t_{10}$. The voltage at node 1 will continue to rise at time $t_{10}$ until it reaches the threshold voltage of transistor M1 at time $t_{12}$. Then, at time $t_{12}$, the voltage at node 1 will drop to system ground (Vss) where it will remain. This pattern is a desired pattern that will cause the voltage at node 1 to reach a voltage high enough to switch on transistor M4 and thereby activate the signal RESET ENABLE.

Thus, an embodiment of a power-up reset override architecture and circuitry has been described for a system that resets whenever power is initially applied and that can also enter a sleep mode. As such, the embodiment guarantees that when a system powers-up to a normal operating voltage, there will be no contention between power-up reset circuitry and sleep signal generation circuitry. In the embodiment described, the reset signal will always be generated on power-up regardless of whether or not a spurious sleep signal is also being generated on power-up.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. In a system comprising a microprocessor coupled to a flash memory by a system bus, a reset circuit comprising:
   a reset signal generation circuit for generating a reset signal when power is applied to the flash memory, the reset signal causing the flash memory to enter a predetermined reset state;
   a sleep signal generation circuit coupled to the reset signal generation circuit, the sleep signal generation circuit generating a sleep signal, the sleep signal causing the reset signal generation circuit to enter an energy saving sleep mode when the flash memory is placed in the sleep mode, the reset signal causing the sleep signal generation circuit to reset and suppress generation of the sleep signal; and
   a reset override signal generation circuit coupled to the reset signal generation circuit, the reset override signal generated during power-up, the reset override signal forcing the reset signal generation circuit to generate the reset signal during power-up even if the reset signal generation circuit is receiving the sleep signal, the reset signal override circuit drawing substantially no power when the flash memory is placed in the sleep mode.

2. The reset circuit as set forth in claim 1 wherein:
   if power is applied to the flash memory, an operating voltage applied to the reset circuit ramps from a first voltage level to a second voltage level, the second voltage level being a normal operating voltage, the first voltage level being substantially less than the second voltage level;
   if the reset signal is generated, the reset signal ramps from the first voltage level to a third voltage level and then returns to the first voltage level, the third voltage level being substantially less than the second voltage level and substantially greater than the first voltage level; and,
   if the reset override signal is generated, the reset override signal ramps from a fourth voltage level to the second voltage level, the fourth voltage level being substantially less than the third voltage level and substantially greater than the first voltage level.

3. The reset circuit as set forth in claim 2 wherein the first voltage level is equal to system ground.

4. The reset circuit as set forth in claim 2 wherein the reset override signal generation circuit comprises:
   a reset override condition sensor, whenever power to the sensor ramps from the first voltage level to the third voltage level, the sensor generating a reset override condition signal, the reset override condition signal dropping to the first voltage level when the power to the sensor reaches the fourth voltage level; and
   a buffer and inversion circuit coupled to the reset override condition sensor, the buffer and inversion circuit generating the reset override signal if the reset override condition signal from the sensor drops from the fourth voltage level.

5. The reset circuit as set forth in claim 4 wherein the reset override condition sensor comprises:
   a first switch, the first switch having a first threshold voltage equal to the fourth voltage level; and
   a capacitor coupled to the first switch, the capacitor holding charge as power to the sensor increases, when the charge reaches the fourth voltage level, the first switch closing and pulling the override condition signal to the first voltage level.

6. The reset circuit as set forth in claim 4 wherein the buffer and inversion circuit comprises:
- a first switch, the first switch having a second threshold voltage equal to a fifth voltage level, the fifth voltage level being substantially less than the fourth voltage level and substantially greater than the first voltage level, when the reset override condition signal rises above the fifth voltage level, the first switch pulling the reset override signal to the first voltage; and
- a second switch coupled to the first switch, the second switch also having the second threshold voltage, when the reset override condition signal drops below the fifth voltage level and the power to the reset override signal generation circuit exceeds the fifth voltage level, the second switch pulling the reset override signal to equal the power to the reset override signal generation circuit.

7. The reset circuit as set forth in claim 6 wherein the reset override signal generation circuit further comprises a voltage clamp coupled to the reset override condition sensor, the voltage clamp holding the reset override condition signal to a sixth voltage level if the reset override condition signal falls below the sixth voltage level, the sixth voltage level equal in magnitude to the first voltage level minus the fifth voltage level.

8. In a system comprising a microprocessor coupled to a flash memory by a system bus, a method of resetting the flash memory, the reset method comprising the steps of:
- providing a reset signal generation circuit for generating a reset signal when power is applied to the flash memory, the reset signal causing the flash memory to enter a predetermined reset state;
- providing a sleep signal generation circuit coupled to the reset signal generation circuit, the sleep signal generation circuit generating a sleep signal, the sleep signal causing the reset signal generation circuit to enter an energy saving sleep mode when the flash memory is placed in the sleep mode, the reset signal causing the sleep signal generation circuit to reset and suppress generation of the sleep signal; and
- providing a reset override signal generation circuit coupled to the reset signal generation circuit, the reset override signal generated during power-up, the reset override signal forcing the reset signal generation circuit to generate the reset signal during power-up even if the reset signal generation circuit is receiving the sleep signal, the reset signal override circuit drawing substantially no power when the flash memory is placed in the sleep mode; and
- applying power to the flash memory.

9. The reset method as set forth in claim 8 wherein:
- if power is applied to the flash memory, an operating voltage applied to the reset signal generation circuit and applied to the reset override signal generation circuit ramps from a first voltage level to a second voltage level, the second voltage level being a normal operating voltage, the first voltage level being substantially less than the second voltage level;
- if the reset signal is generated, the reset signal ramps from the first voltage level to a third voltage level and then returns to the first voltage level, the third voltage level being substantially less than the second voltage level and substantially greater than the first voltage level; and,
- if the reset override signal is generated, the reset override signal ramps from a fourth voltage level to the second voltage level, the fourth voltage level being substantially less than the third voltage level and substantially greater than the first voltage level.

10. The reset method as set forth in claim 9 wherein the first voltage level is equal to system ground.

11. The reset method as set forth in claim 9 wherein the step of providing the reset override signal generation circuit comprises the steps of:
- providing a reset override condition sensor, whenever power to the sensor ramps from the first voltage level to the third voltage level, the sensor generating a reset override condition signal, the reset override condition signal dropping to the first voltage level when the power to the sensor reaches the fourth voltage level; and
- providing a buffer and inversion circuit coupled to the reset override condition sensor, the buffer and inversion circuit generating the reset override signal if the reset override condition signal from the sensor drops from the fourth voltage level.

12. The reset method as set forth in claim 11 wherein the step of providing the reset override condition sensor comprises the steps of:
- providing a first switch, the first switch having a first threshold voltage equal to the fourth voltage level; and
- providing a capacitor coupled to the first switch, the capacitor holding charge as power to the sensor increases, when the charge reaches the fourth voltage level, the first switch closing and pulling the override condition signal to the first voltage level.

13. The reset method as set forth in claim 11 wherein the step of providing the buffer and inversion circuit comprises the steps of:
- providing a first switch, the first switch having a second threshold voltage equal to a fifth voltage level, the fifth voltage level being substantially less than the fourth voltage level and substantially greater than the first voltage level, when the reset override condition signal rises above the fifth voltage level, the first switch pulling the reset override signal to the first voltage; and
- providing a second switch coupled to the first switch, the second switch also having the second threshold voltage, when the reset override condition signal drops below the fifth voltage level and the power to the reset override signal generation circuit exceeds the fifth voltage level, the second switch pulling the reset override signal to equal the power to the reset override signal generation circuit.

14. The reset method as set forth in claim 13 wherein the step of providing the reset override signal generation circuit further comprises the step of:
- providing a voltage clamp coupled to the reset override condition sensor, the voltage clamp holding the reset override condition signal to a sixth voltage level if the reset override condition signal falls below the sixth voltage level, the sixth voltage level equal in magnitude to the first voltage level minus the fifth voltage level.

15. A system comprising:
- a microprocessor;
- a system bus;

a flash memory coupled to the microprocessor by the system bus, the flash memory having a reset circuit comprising:

a reset signal generation circuit for generating a reset signal when power is applied to the flash memory, the reset signal causing the flash memory to enter a predetermined reset state;

a sleep signal generation circuit coupled to the reset signal generation circuit, the sleep signal generation circuit generating a sleep signal, the sleep signal causing the reset signal generation circuit to enter an energy saving sleep mode when the flash memory is placed in the sleep mode, the reset signal causing the sleep signal generation circuit to reset and suppress generation of the sleep signal; and a reset override signal generation circuit coupled to the reset signal generation circuit, the reset override signal generated during power-up, the reset override signal forcing the reset signal generation circuit to generate the reset signal during power-up even if the reset signal generation circuit is receiving the sleep signal, the reset signal override circuit drawing substantially no power when the flash memory is placed in the sleep mode.

16. The system as set forth in claim 15 wherein:

if power is applied to the flash memory, an operating voltage applied to the reset circuit ramps from a first voltage level to a second voltage level, the second voltage level being a normal operating voltage, the first voltage level being substantially less than the second voltage level;

if the reset signal is generated, the reset signal ramps from the first voltage level to a third voltage level and then returns to the first voltage level, the third voltage level being substantially less than the second voltage level and substantially greater than the first voltage level; and, if the reset override signal is generated, the reset override signal ramps from a fourth voltage level to the second voltage level, the fourth voltage level being substantially less than the third voltage level and substantially greater than the first voltage level.

17. The system as set forth in claim 16 wherein the first voltage is equal to system ground.

18. The system as set forth in claim 16 wherein the reset override signal generation circuit comprises:

a reset override condition sensor, whenever power to the sensor ramps from the first voltage level to the third voltage level, the sensor generating a reset override condition signal, the reset override condition signal dropping to the first voltage level when the power to the sensor reaches the fourth voltage level; and a buffer and inversion circuit coupled to the reset override condition sensor, the buffer and inversion circuit generating the reset override signal if the reset override condition signal from the sensor drops from the fourth voltage level.

19. The system as set forth in claim 18 wherein the reset override condition sensor comprises:

a first switch, the first switch having a first threshold voltage equal to the fourth voltage level; and a capacitor coupled to the first switch, the capacitor holding charge as power to the sensor increases, when the charge reaches the fourth voltage level, the first switch closing and pulling the override condition signal to the first voltage level.

20. The system as set forth in claim 18 wherein the buffer and inversion circuit comprises:

a first switch, the first switch having a second threshold voltage equal to a fifth voltage level, the fifth voltage level being substantially less than the fourth voltage level and substantially greater than the first voltage level, when the reset override condition signal rises above the fifth voltage level, the first switch pulling the reset override signal to the first voltage; and a second switch coupled to the first switch, the second switch also having the second threshold voltage, when the reset override condition signal drops below the fifth voltage level and the power to the reset override signal generation circuit exceeds the fifth voltage level, the second switch pulling the reset override signal to equal the power to the reset override signal generation circuit.

21. The system as set forth in claim 20 wherein the reset override signal generation circuit further comprises a voltage clamp coupled to the reset override condition sensor, the voltage clamp holding the reset override condition signal to a sixth voltage level if the reset override condition signal falls below the sixth voltage level, the sixth voltage level equal in magnitude to the first voltage level minus the fifth voltage level.

22. A reset circuit for a flash memory comprising:

a reset signal generation means for generating a reset signal when power is applied to the flash memory, the reset signal causing the flash memory to enter a predetermined reset state;

a sleep signal generation means coupled to the reset signal generation means, the sleep signal generation means generating a sleep signal, the sleep signal causing the reset signal generation means to enter an energy saving sleep mode when the flash memory is placed in the sleep mode, the reset signal causing the sleep signal generation means to reset and suppress generation of the sleep signal; and a reset override signal generation means coupled to the reset signal generation means, the reset override signal generation means for generating a reset override signal, the reset override signal generated during power-up, the reset override signal forcing the reset signal generation means to generate the reset signal during power-up even if the reset signal generation means is receiving the sleep signal, the reset signal override means drawing substantially no power when the flash memory is placed in the sleep mode.

23. The reset circuit as set forth in claim 22 wherein:

if power is applied to the flash memory, an operating voltage applied to the reset circuit ramps from a first voltage level to a second voltage level, the second voltage level being a normal operating voltage, the first voltage level being substantially less than the second voltage level;

if the reset signal is generated, the reset signal ramps from the first voltage level to a third voltage level and then returns to the first voltage level, the third voltage level being substantially less than the second voltage level and substantially greater than the first voltage level; and, if the reset override signal is generated, the reset override signal ramps from a fourth voltage level to the second voltage level, the fourth voltage level being substantially less than the third voltage level and substantially greater than the first voltage level.

24. The reset circuit as set forth in claim 23 wherein the first voltage is equal to system ground.

25. The reset circuit as set forth in claim 23 wherein the reset override signal generation means comprises:
- a reset override condition sensing means, whenever power to the sensing means ramps from the first voltage level to the third voltage level, the sensing means generating a reset override condition signal, the reset override condition signal dropping to the first voltage level when the power to the sensing means reaches the fourth voltage level; and
- a buffer and inversion means coupled to the reset override condition sensing means, the buffer and inversion means for generating the reset override signal if the reset override condition signal from the sensing means drops from the fourth voltage level.

26. The reset circuit as set forth in claim 25 wherein the reset override condition sensing means comprises:
- a first switching means, the first switching means having a first threshold voltage equal to the fourth voltage level; and
- a capacitor means coupled to the first switching means, the capacitor means holding charge as power to the sensing means increases, when the charge reaches the fourth voltage level, the first switching means closing and pulling the override condition signal to the first voltage level.

27. The reset circuit as set forth in claim 25 wherein the buffer and inversion means comprises:
- a first switching means, the first switching means having a second threshold voltage equal to a fifth voltage level, the fifth voltage level being substantially less than the fourth voltage level and substantially greater than the first voltage level, when the reset override condition signal rises above the fifth voltage level, the first switching means pulling the reset override signal to the first voltage; and
- a second switching means coupled to the first switching means, the second switching means also having the second threshold voltage, when the reset override condition signal drops below the fifth voltage level and the power to the reset override signal generation means exceeds the fifth voltage level, the second switching means pulling the reset override signal to equal the power to the reset override signal generation means.

28. The reset circuit as set forth in claim 27 wherein the reset override signal generation means further comprises a voltage clamping means coupled to the reset override condition sensing means, the voltage clamping means holding the reset override condition signal to a sixth voltage level if the reset override condition signal falls below the sixth voltage level, the sixth voltage level equal in magnitude to the first voltage level minus the fifth voltage level.

* * * * *